US007028908B2

(12) United States Patent
Kuroda et al.

(10) Patent No.: US 7,028,908 B2
(45) Date of Patent: Apr. 18, 2006

(54) RECORDING MEDIUM, AND RECORDING APPARATUS, REPRODUCING APPARATUS, RECORDING METHOD AND CONTROL METHOD THEREOF

(75) Inventors: Kazuo Kuroda, Tsurugashima (JP); Shuuichi Yanagisawa, Tsurugashima (JP)

(73) Assignee: Pioneer Corporation, Tokyo-to (JP)

( * ) Notice: Subject to any disclaimer, the term of this patent is extended or adjusted under 35 U.S.C. 154(b) by 110 days.

(21) Appl. No.: 10/457,361

(22) Filed: Jun. 10, 2003

(65) Prior Publication Data

US 2004/0035920 A1 Feb. 26, 2004

(30) Foreign Application Priority Data

Jun. 11, 2002 (JP) ............................ 2002-169617

(51) Int. Cl.
*G06K 7/00* (2006.01)

(52) U.S. Cl. ...................................... 235/486; 235/487

(58) Field of Classification Search ................ 235/486, 235/487, 482, 375; 705/51, 57, 58
See application file for complete search history.

(56) References Cited

U.S. PATENT DOCUMENTS

| | | | | |
|---|---|---|---|---|
| 5,530,235 | A * | 6/1996 | Stefik et al. | 235/492 |
| 5,708,709 | A * | 1/1998 | Rose | 705/59 |
| 6,513,719 | B1 * | 2/2003 | Imura | 235/492 |
| 6,592,032 | B1 * | 7/2003 | Takaragi et al. | 235/382 |
| 6,817,535 | B1 * | 11/2004 | Epstein | 235/492 |
| 6,832,731 | B1 * | 12/2004 | Kaneko | 235/492 |

FOREIGN PATENT DOCUMENTS

| | | |
|---|---|---|
| DE | 19922035 | 11/2000 |
| EP | 1 041 573 | 10/2000 |

* cited by examiner

*Primary Examiner*—Daniel Stcyr
(74) *Attorney, Agent, or Firm*—Young & Thompson

(57) ABSTRACT

A recording medium such as a semiconductor recording medium is provided with: a data area in which data is recorded; and a management information area in which management information of the data recorded in the data area is recorded. The recording medium is further provided with an effective duration area in which an effective duration of the data recorded in the data area is recorded.

5 Claims, 7 Drawing Sheets

RECORDING MEDIUM, AND RECORDING APPARATUS, REPRODUCING APPARATUS, RECORDING METHOD AND CONTROL METHOD THEREOF

BACKGROUND OF THE INVENTION

1. Field of the Invention

The present invention relates to the structure of a repeatedly-usable recording medium, such as a semiconductor recording medium for example, in which the reproducible period of data which is recorded, i.e. the effective duration of record data, can be freely set and also relates to a control method thereof.

2. Description of the Related Art

By virtue of the development of microfabrication technique for semiconductor, high-density, high-integration semiconductor apparatuses have been manufactured and supplied. Especially, in a semiconductor memory prepared by a submicron rule, the number of memory elements formed in one chip has become enormous, and thus it has become possible to record long-running music and videos, coupled with the reduction of bit's unit price as well as the development of data compression technique.

In the semiconductor memory of this kind, which can be easily used as a recording medium even from a cost viewpoint, there may be expected the following utilization form in which recorded data is deleted or cannot be read out after a predetermined period: e.g. a commuter pass or ticket and a utilization in the rental field of renting music, a video soft, and the like.

As the semiconductor memory corresponding to this utilization form, for example, Japanese Patent Application Laying Open NO. Hei 10-189780 discloses one example of the technique. According to this disclosure, a gate insulating layer is provided with: a first layer of a silicon dioxide film; a second layer of a silicon nitride film; and a third layer of a silicon dioxide film, for example, and the composition ratio of silicon/nitrogen (Si/N) in the second layer of the silicon nitride film is set so as to correspond to a desired data effective duration. This construction is used to try to positively form a shallow charge lap, which causes the deterioration of memory holding, and reduce electrical charges accumulated in a charge accumulation mechanism to shorten the lifetime of the data holding, thereby setting the data effective duration. In the memory in this form, the lifetime of record data is determined by controlling the composition ratio of Si/N in the silicon nitride film in the chip production.

However, the above-described memory in which the composition ratio of Si/N is controlled at the time of production so as to determine the effective duration of record data has a problem that the memory lifetime is determined at the time of the production and cannot be changed. Moreover, the lifetime is based on the production time point, and when data is actually recorded, it is difficult to learn the elapsed time from the production time point, so that it is difficult or impossible to learn the effective duration of the recorded data from that time point, which leaves difficulties in practical use.

SUMMARY OF THE INVENTION

It is therefore an object of the present invention to provide a recording medium, such as a semiconductor recording medium for example, which may be repeatedly-usable, in which the lifetime of recorded data, i.e., the reproducible effective duration of the recorded data, can be freely set, and to provide a control method thereof.

The above object of the present invention can be achieved by a recording medium provided with: a data area in which data is recorded; a management information area in which management information of the data recorded in the data area is recorded; and an effective duration area in which an effective duration of the data recorded in the data area is recorded.

According to the recording medium such as a semiconductor recording medium for example, of the present invention, within one semiconductor chip for example, it is provided with: the data area in which data is recorded; the management information area in which management information of the recorded data is recorded; and the effective duration area in which an effective duration of the recorded data is recorded. The recording medium is in such a form that the effective duration is a period in which the recorded data is effective, i.e. a period in which the recorded data is reproducible, and that the reproduction of the data becomes impossible after this period has elapsed.

According to the recording medium, it is possible to set the effective duration of the data which is recorded and offer information. By setting this effective duration, it is possible to set a utilization fee or charge of the recorded data and the like. Even after the effective duration is expired, it is possible to record/reproduce the data again under a new condition, thereby to repeatedly use it.

In one aspect of the recording medium of the present invention, it is further provided with: a time-measurement device for measuring an elapse of time; a comparison device for comparing the effective duration recorded in the effective duration area with an elapsed time measured by the time-measurement device; and a data invalidation device for invalidating the data recorded in the data area when the elapsed time has reached the effective duration.

According to this aspect, the time-measurement device measures the elapse of time. The comparison device compares the effective duration with the elapsed time. Then, the data invalidation device invalidates the recorded data when the elapsed time has passed over the effective duration.

The data and its management information are recorded in the relative recording area, and the effective duration of the data is set. After the effective duration is set, the measurement of the elapsed time is started by the time measurement device, e.g. a timer, and the effective duration and the elapsed time are always compared. If the elapsed time does not reach the effective duration, it is possible to reproduce the recorded data. On the other hand, if the elapsed time has passed over the effective duration, it is impossible to reproduce the recorded data.

In another aspect of the recording medium of the present invention, it is further provided with a power supply device for supplying an electric power.

According to this aspect, even if the electric power is not supplied from the exterior, the recording medium of the present invention allows the operations of the time measurement device, the comparison device, and the data invalidation device. The power supply device may be provided with a capacitor, and when the electric power is supplied from an external power source, electric charges are accumulated, and thus it operates as a power source.

In another aspect of the recording medium of the present invention, the data area is provided with a plurality of independent data areas.

According to this aspect, it is possible to treat each of the plurality of data areas as one processing unit. For example, it is possible to take such a recording form that one piece of music is allocated to one data area, or the like, which facilitates the management of data.

In another aspect of the recording medium of the present invention, it is further provided with a setting device for independently setting the effective duration to each of the plurality of data areas.

According to this aspect, it is possible to set the independent effective duration to each of the plurality of data areas, so that it is possible to treat different data having different effective durations within one chip.

In another aspect of the recording medium of the present invention, it is further provided with: an encryption device for encrypting the data which is recorded in the data area on the basis of a predetermined encryption key; and an encryption key recording area in which the encryption key is recorded.

According to this aspect, it is possible to ensure the confidentiality of the data which is recorded, and by deleting the encryption key, it is possible to perform processing of making the data reproduction impossible. Since the encryption key is deleted, it is possible to perform this processing at a high speed regardless of the amount of the recorded data. Moreover, by inputting the encryption key under a predetermined condition, it is possible to reproduce the recorded data again.

In another aspect of the recording medium of the present invention, it is further provided with a power supply device for supplying an electric power; and a power cut-off device for cutting off the electric power from the power supply device.

According to this aspect, it is possible to make the reproduction of the recorded data impossible by cutting off a power supply of the electric power. In a volatile memory, by cutting off the power supply to the data area, it becomes impossible to access the data, and also the data will be erased. In a non-volatile memory, it becomes impossible to access the data, but the data can be held. Therefore, in the non-volatile memory, it is possible to reproduce the data by supplying the electric power again under a predetermined condition.

Moreover, it is also possible to delete the encryption key by cutting off a power supply to the encryption key recording area, and thus it is possible to make the data reproduction impossible. In this case, since the data itself keeps the recorded state, it is possible to reproduce the data by inputting the encryption key under a predetermined condition.

In another aspect of the recording medium of the present invention, the data invalidation device is a device for deleting the data recorded in the data area.

According to this aspect, with respect to the data recorded in the data area, the data reproduction becomes impossible by deleting the data with the data invalidation device.

In another aspect of the recording medium of the present invention, the data invalidation device is a device for deleting the management information recorded in the management information area.

According to this aspect, with respect to the data recorded in the data area, the data reproduction becomes impossible by deleting the management information with the data invalidation device.

In another aspect of the recording medium of the present invention, it is further provided with: an encryption device for encrypting the data which is recorded in the data area on the basis of a predetermined encryption key; and an encryption key recording area in which the encryption key is recorded, wherein the data invalidation device is a device for deleting the encryption key recorded in the encryption key recording area.

According to this aspect, with respect to the data recorded in the data area, the data reproduction becomes impossible by deleting the encryption key with the data invalidation device.

In another aspect of the recording medium of the present invention, it is further provided with: a power supply device for supplying an electric power; and a power cut-off device for cutting off the electric power from the power supply device, wherein the data invalidation device is a device for cutting off the electric power to the data area by the power cut-off device.

According to this aspect, with respect to the data recorded in the data area, the data reproduction becomes impossible by cutting off a power supply of the electric power to the data area with the data invalidation device.

In another aspect of the recording medium of the present invention, it is further provided with: a power supply device for supplying an electric power; and a power cut-off device for cutting off the electric power from the power supply device, the data invalidation device is a device for cutting off the electric power to the management information area by the power cut-off device.

According to this aspect, with respect to the data recorded in the data area, the data reproduction becomes impossible by cutting off a power supply of the electric power to the management information area with the data invalidation device.

In another aspect of the recording medium of the present invention, it is further provided with: a power supply device for supplying an electric power; a power cut-off device for cutting off the electric power from the power supply device; an encryption device for encrypting the data which is recorded in the data area on the basis of a predetermined encryption key; and an encryption key recording area in which the encryption key is recorded, wherein the data invalidation device is a device for cutting off the electric power to the encryption key recording area by the power cut-off device.

According to this aspect, with respect to the data recorded in the data area, the data reproduction becomes impossible by cutting off a power supply of the electric power to the encryption key recording area with the data invalidation device.

In another aspect of the recording medium of the present invention, the effective duration area is placed within the management information area.

According to this aspect, the management information of the data which is recorded as well as the information indicating the effective duration of the data are recorded in the management information area as one unit, and thus it is possible to effectively manage the duration of the data.

The above object of the present invention can be achieved by a reproducing apparatus for reproducing data recorded in a recording medium, the recording medium provided with: a data area in which data is recorded; a management information area in which management information of the data recorded in the data area is recorded; and an effective duration area in which an effective duration of the data recorded in the data area is recorded, the reproducing apparatus provided with: a reading device for reading out the effective duration recorded in the effective duration area of the recording medium; a time-measurement device for measuring a current time point; a comparison device for comparing the effective duration with the current time point; and a prohibition device for prohibiting the reproduction of the data recorded in the data area if it is judged by the comparison device that the current time point has passed over the effective duration.

According to the reproducing apparatus of the present invention, the effective duration recorded in the effective duration area is read out and is compared with a current time point with respect to the recording medium such as a semiconductor recording medium for example, provided with: the data area in which data is recorded; the management information area in which management information of the data recorded in the data area is recorded; and the effective duration area in which an effective duration of the data recorded in the data area is recorded. If the current time point has passed over the effective duration, the record data is not reproduced. Therefore, using a relatively simple construction, it is possible to form the recording medium in which the data effective duration can be set. Not only prohibiting the data reproduction, it may destroy the data.

The above object of the present invention can be achieved by a recording apparatus for recording data into the above-described recording medium (including its various aspects), the recording apparatus provided with: a recording device for recording the effective duration in the effective duration area.

According to the recording apparatus of the present invention, with respect to the recording medium such as a semiconductor recording medium for example, in which the effective duration is to be recorded in the effective duration area, it is possible to input and record its arbitrary effective duration.

In one aspect of the recording apparatus of the present invention, it is provided with: a setting device for setting the effective duration which is recorded in the effective duration area.

According to this aspect, it is possible to arbitrarily set the effective duration which is recorded in the effective duration area of the recording medium. Therefore, for example, in such an application method that the utilization fee or charge of recorded data is determined from the effective duration, it is possible to set an arbitrary effective duration depending on the payment of a user. For example, if the recording apparatus is a personal computer, it is possible to set it using its keyboard.

The above object of the present invention can be achieved by a recording method of recording data into a recording medium, provided with: a first setting process of setting an effective duration of the data which is to be recorded in the recording medium; a second setting process of setting an encryption key for encrypting the data which is to be recorded; an encryption process of encrypting the data which is to be recorded on the basis of the set encryption key; and a recording process of recording the encrypted data into the recording medium.

According to the recording method of the present invention, an effective duration of data which is to be recorded is set, an encryption key is set in order to encrypt the data which is to be recorded, the data which is to be recorded is encrypted on the basis of the encryption key, and the encrypted data is recorded. Therefore, in this recording method, it is possible to ensure the confidentiality of the data which is recorded and to set a reproducible period, which allows the strict management of the data.

The above object of the present invention can be achieved by a control method of controlling a recording medium, the recording medium provided with: a data area in which data is recorded; an encryption key recording area in which an encryption key for encrypting the data is recorded; a management information area in which management information of the data recorded in the data area is recorded; a comparison device for comparing an effective duration of the data with an elapsed time; and a data invalidation device for invalidating the data, the control method provided with any one of the processes of: (i) deleting the data recorded in the data area by the data invalidation device; (ii) deleting the management information recorded in the management information area by the data invalidation device; and (iii) deleting the encryption key recorded in the encryption key recording area by the data invalidation device, the data being invalidated by the any one of the processes when it is judged by the comparison device that the elapsed time has passed over the effective duration.

According to the control method of controlling a recording medium such as a semiconductor recording medium for example, the recording medium is equipped with: the data area; the encryption key recording area; and the management information area. By using any one of the processes of: deleting the data; deleting the management information; and deleting the encryption key, the data reproduction is made impossible by the data invalidation device when the elapsed time has passed over the data effective duration.

The above object of the present invention can be achieved by a control method of controlling a recording medium, the recording medium provided with: a data area in which data is recorded; an encryption key recording area in which an encryption key for encrypting the data is recorded; a management information area in which management information of the data recorded in the data area is recorded; a power supply device; a power cut-off device; a comparison device for comparing an effective duration of the data with an elapsed time; and a data invalidation device for invalidating the data, the control method provided with any one of the processes of: (i) cutting off a power supply to the data area; (ii) cutting off a power supply to the management information area; and (iii) cutting off a power supply to the encryption key recording area, the data being invalidated by the any one of the processes when it is judged by the comparison device that the elapsed time has passed over the effective duration.

According to the control method of controlling a recording medium such as a semiconductor recording medium for example, the recording medium is equipped with: the data area; the encryption key recording area; the management information area; the power supply device; and the power cut-off device. By using any one of the processes of: cutting off a power supply to the data area; cutting off a power supply to the management information area; and cutting off a power supply to the encryption key recording area, the data reproduction is made impossible by the data invalidation device when the elapsed time has passed over the data effective duration.

The nature, utility, and further features of this invention will be more clearly apparent from the following detailed description with reference to preferred embodiments of the invention when read in conjunction with the accompanying drawings briefly described below.

DETAILED DESCRIPTION OF THE PREFERRED EMBODIMENTS

A semiconductor recording medium as one example of the recording medium associated with the present invention is a memory in such a form that a reproducible period of recorded data can be set and that the data cannot be reproduced after the period passes. The semiconductor recording medium is an information recording medium preferably used for a commuter pass or ticket having a determined expiration date and the rental of music and a video soft.

Incidentally, the form in which the data cannot be reproduced is not limited to that record data itself is deleted, but includes that destroying management or administration information, or an encryption key to thereby eventually make the recorded data not-reproducible, or the like. Moreover, it is not limited to the use for a memory system detachable to an electronic device, but is applicable to a memory system built-in an electronic device.

(First Embodiment of Semiconductor Recording Medium)

Figure 1:
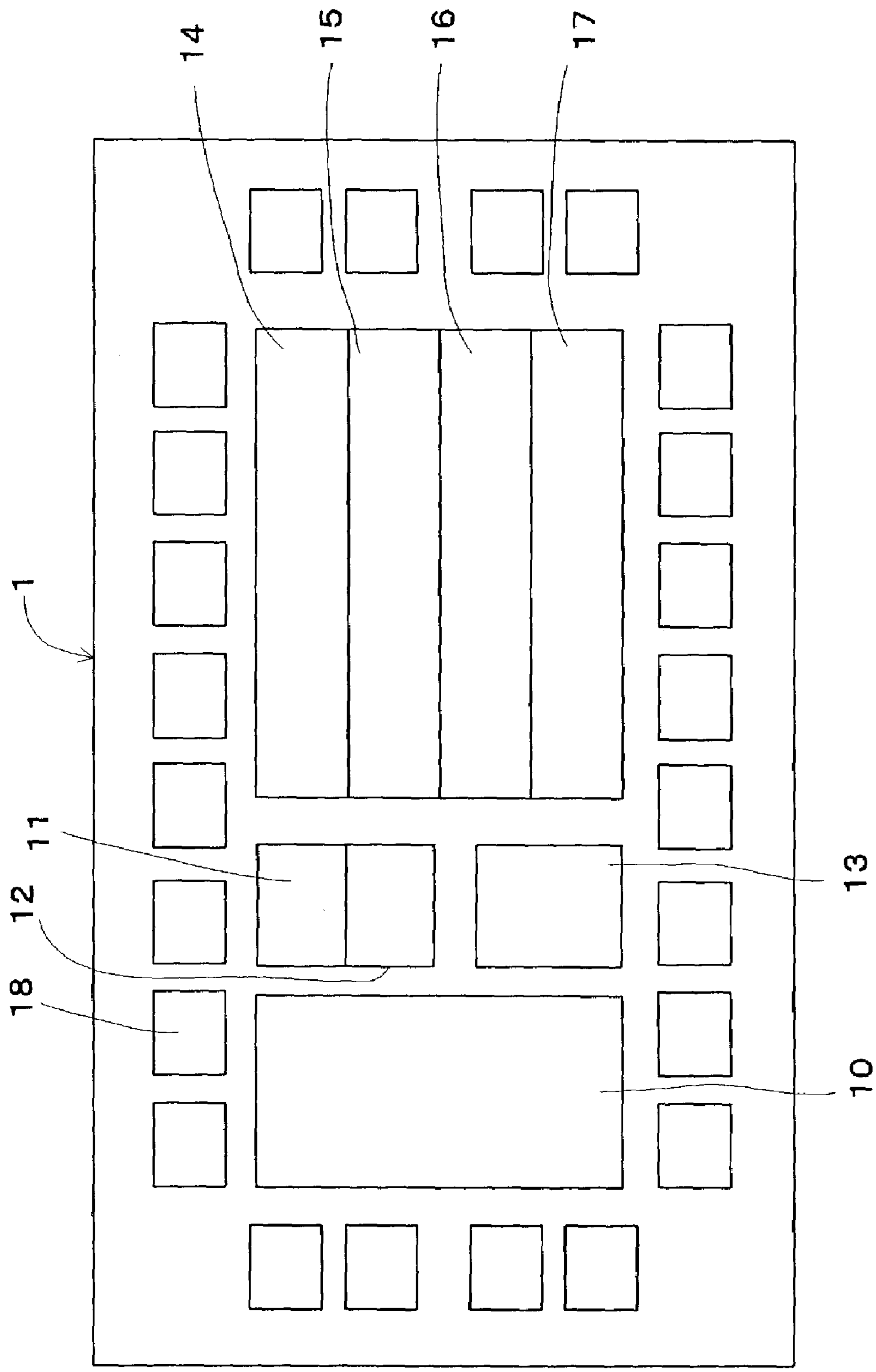
FIG. 1 is a schematic diagram showing a first embodiment of a semiconductor recording medium of the present invention.
Figure 4:
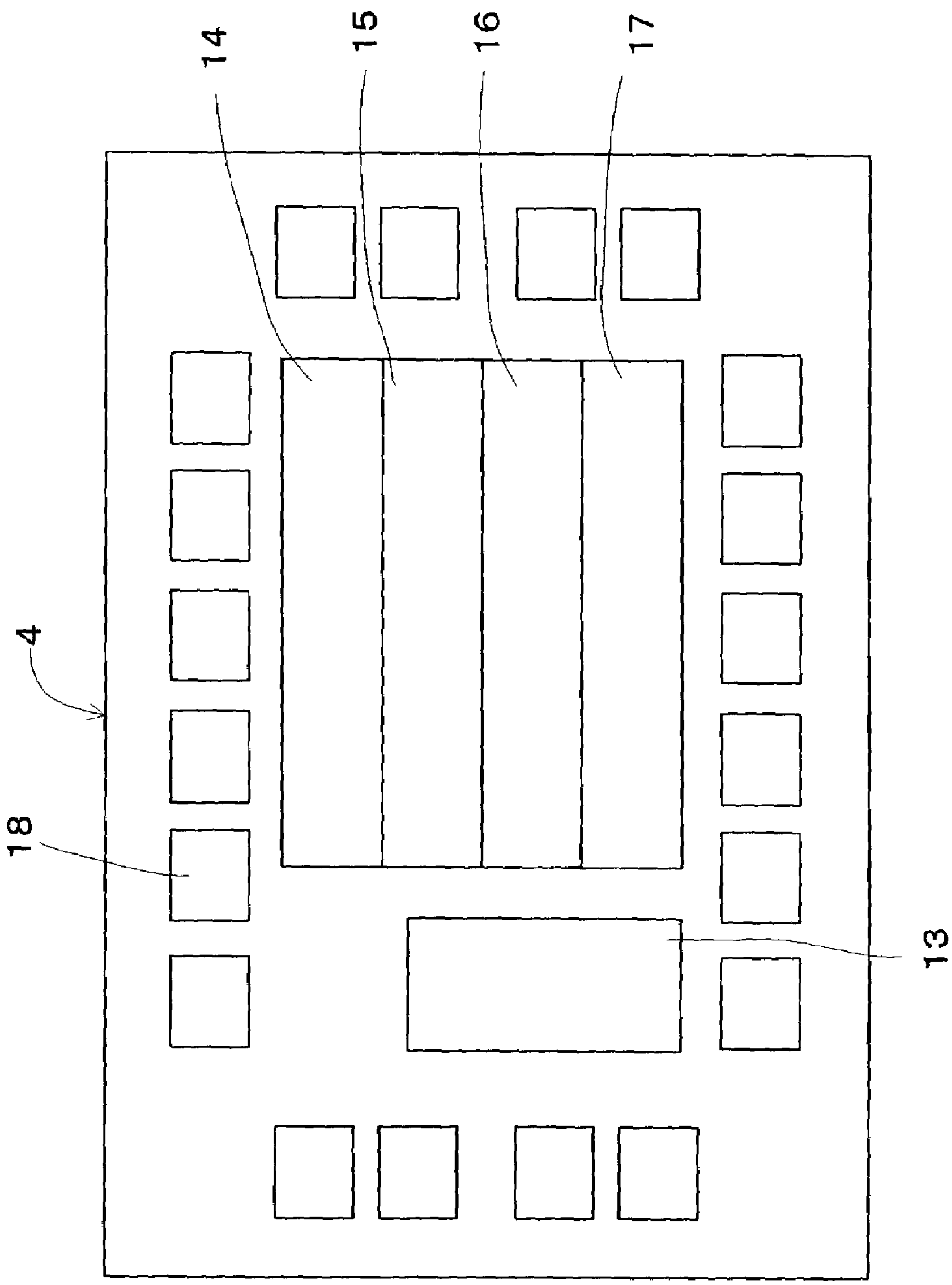
FIG. 4 is a schematic diagram showing a comparison example of a semiconductor recording medium.
Figure 5:
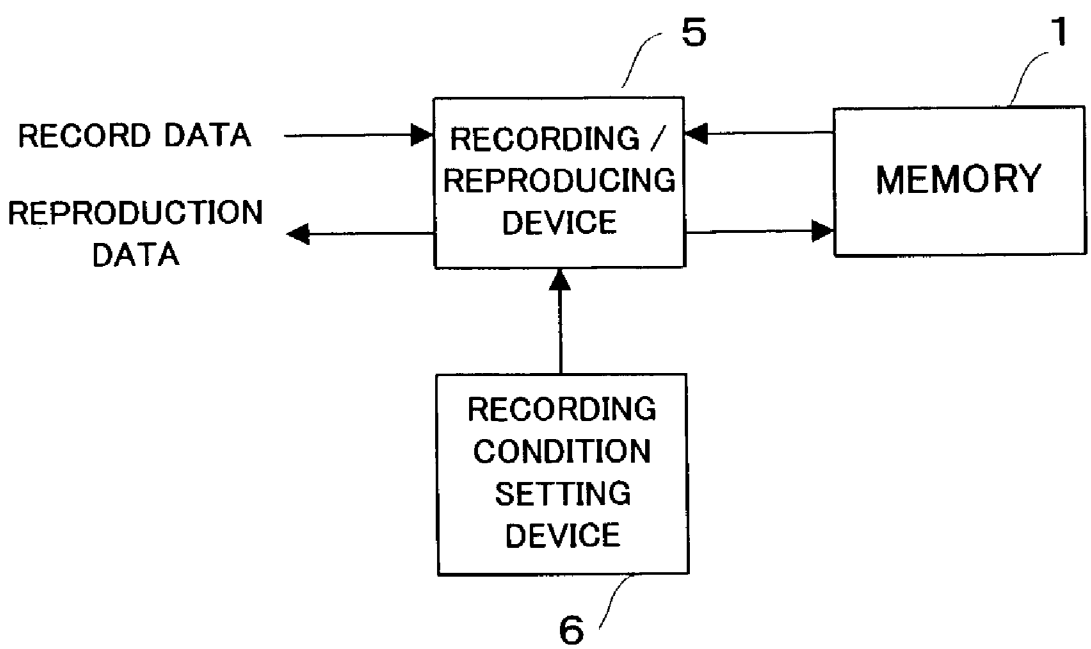
FIG. 5 is a schematic block diagram showing a recording reproducing system using the semiconductor recording medium of the present invention.

The first embodiment of the semiconductor recording medium of the present invention will be explained with reference to FIG. 1, FIG. 4, and FIG. 5. FIG. 1 is a schematic diagram showing the first embodiment of the semiconductor recording medium of the present invention. FIG. 4 is a schematic diagram showing a comparison example of a semiconductor recording medium. FIG. 5 is a schematic block diagram showing a recording/reproducing system using the semiconductor recording medium of the present embodiment.

As shown in FIG. 1, a memory 1 associated with the first embodiment of the semiconductor recording medium is provided with: a battery 10; a timer 11; a data controller 12; an address controller 13; data storage areas 14, 15, 16, and 17; and a bonding pad 18.

The battery 10 is used in case of a volatile memory for: data holding; the time measurement operation of the timer 11; the data delete control operation of the data controller 12; and the memory address control operation of the address controller 13, when an electric power is not supplied from the exterior. In case of a non-volatile memory, it is used for: the time measurement operation of the timer 11; the data delete control operation of the data controller 12; and the memory address control operation of the address controller 13, when an electric power is not supplied from the exterior.

Data recorded in the data storage areas 14, 15, 16, and 17 is to be made not-reproducible after a preset period has elapsed, by deleting the data or the management information or the like. Thus, even if an external electric power is not supplied, it is necessary for the timer 11 to accurately measure a time length. Moreover, when the period has elapsed, it is required to control the data controller 12 and the address controller 13 to delete the data. Furthermore, if the memory 1 is in the condition that an electric power is not supplied from the external power source thereto, the battery 10 is required for the data holding in the volatile memory.

The battery 10 is provided with a capacitor and is prepared by general-purpose semiconductor production technique, and thus it is not necessary to introduce a special process to the production of the memory 1. This capacitor acts as a power source by accumulating electric charges, wherein the accumulation of electric charges are performed by charging the memory 1 each time when connecting it with the external power source to use it.

The timer 11 measures elapsed time after the recording of recorded data. The measurement of a time length is started by resetting and starting again the timer 11 when data such as music, a video or a computer soft is recorded. The timer 11 needs to measure a time length even when the external electric power is not supplied to the memory 1, and in that case, an electric power is supplied to the timer 11 from the battery 10.

The data controller 12 makes data reproduction impossible when the time length measured by the timer 11 has passed over or exceeded the preset effective duration of data. In order to realize the non-reproducibility of data, the data itself may be deleted, or the management data may be destroyed or deleted, or the like. The data controller 12 is also used for recording the management information about data which is recorded in addition to the data effective duration. Optionally, an area in which the management information is recorded may be provided. As the management information, in addition to the data effective duration, there are a data address, a file name, an attribute, and the like, for example. The data controller 12 needs to operate even when the external electric power is not supplied to the memory 1, and in that case, an electric power is supplied to the data controller 12 from the battery 10.

The address controller 13 specifies storage positions of data in the data storage areas 14, 15, 16, and 17 on the basis of the addresses of rows and columns inputted from an external terminal, and generates an address at the time of deleting the data when the data effective duration has elapsed. The address controller 13 needs to operate even when the external electric power is not supplied to the memory 1, and in that case, an electric power is supplied to the address controller 13 from the battery 10.

The data storage areas 14, 15, 16, and 17 are areas for storing therein data, and it is possible to set the data effective duration for each area. Obviously, it may be a single area, and further it may be divided into many areas. In case of the volatile memory, when the external electric power is not supplied, an electric power is supplied to the data storage areas 14, 15, 16, and 17 from the battery 10.

The bonding pad 18 is a connection terminal for taking an electrical connection with an external circuit. It is provided with terminals corresponding to the power source, the input/output of data, the data address, a recording/reproducing signal, a control signal of the memory 1, and the like.

FIG. 4 is a schematic diagram showing a comparison example of a semiconductor recording medium 4 in order to compare with the memory 1 of the present invention. The battery 10, the timer 11, and the data controller 12 in the memory 1 are not provided for the semiconductor recording medium 4. The structures and the functions of the address controller 13, the data storage areas 14, 15, 16, and 17, and the bonding pad 18 in the semiconductor recording medium 4 are the same as those of the above-described memory 1.

The recording/reproducing system configuration for the memory 1, as shown in FIG. 5, is provided with a recording/reproducing device 5 and a recording condition setting device 6. This system may be provided with a personal computer or the like. When recording data, the record data is recorded in a predetermined area of the memory 1 under the control of the recording/reproducing device 5. At this time, the specification of an area, the data effective duration, the data management information, and the like are inputted by the recording condition setting device 6. After these data are inputted, the time measurement is started by the timer 11. When reproducing the data, if the data effective duration has not elapsed, the typical reproduction operation is performed, and if it has elapsed, the reproduction is not performed and a predetermined comment may be outputted. Moreover, this system may be also constructed such that the data effective duration can be changed under a predetermined condition, e.g. additional charges in the rental of a soft.

(Second Embodiment)

The second embodiment of the semiconductor recording medium of the present invention will be explained with reference to FIG. 2. The second embodiment relates to a memory for making the reproduction of data impossible if the preset effective duration of data has elapsed, and for encrypting and then recording the data which is recorded.

Figure 2:
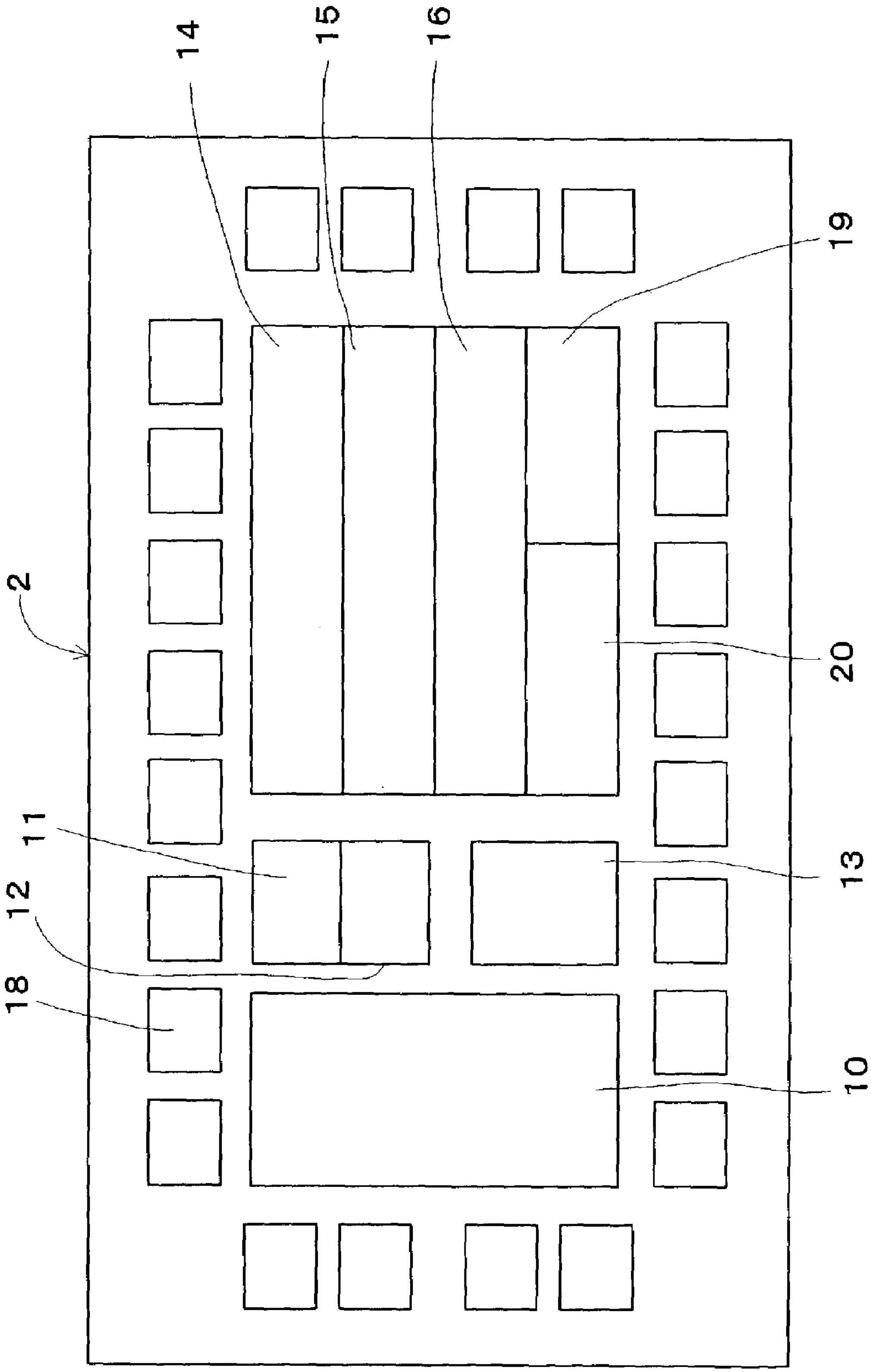
FIG. 2 is a schematic diagram showing a second embodiment of the semiconductor recording medium of the present invention.

As shown in FIG. 2, a memory 2 associated with the second embodiment of the semiconductor recording medium is provided with: the battery 10; the timer 11; the data controller 12; the address controller 13; the data storage areas 14, 15, and 16; the bonding pad 18; an encryption key storage area 19; and an encryption circuit 20.

The structures, the operations, and the functions of the battery 10; the timer 11; the data controller 12; the address controller 13; the data storage areas 14, 15, and 16; and the bonding pad 18 are the same as those of the above-explained memory 1, and their repeating explanations will be omitted here.

The encryption key storage area 19 is an area for storing therein an encryption key for encrypting data which is recorded, and is also used even in the case of decoding the encrypted data. It is possible to ensure the confidentiality of data, and if the data effective duration has elapsed and the reproduction of the data is to be disabled, it is possible to disable the decoding of the data and eventually disable the reproduction of the data by deleting this encryption key. In this case, since only the encryption key is deleted, it is possible to make the data reproduction impossible for a short time regardless of the amount of the recorded data.

Moreover, since the recorded data itself is not deleted, it is possible to construct a system in which an encryption key can be offered again under a predetermined condition, e.g. by paying the owner of the data, and in which the data can be reproduced by recording it in the encryption key storage area 19.

Furthermore, it is necessary to delete the encryption key when the data effective duration has elapsed, even when the external electric power is not supplied to the memory 2, and in that case, an electric power is supplied to the encryption key storage area 19 from the battery 10.

The encryption circuit 20 is a circuit for encrypting data to be recorded on the basis of the encryption key. It may include a decoding circuit used when reproducing, or it may read out the encrypted data and the encryption key, which may be decoded by an external apparatus, such as a personal computer.

Obviously, the recording/reproducing system configuration shown in FIG. 5 can be applied to the memory 2.

(Third Embodiment)

The third embodiment of the semiconductor recording medium of the present invention will be explained with reference to FIG. 3. The feature of the third embodiment is such that it is further provided with a power cut-off device for cutting off a power supply in addition to the configurations of the first and second embodiments. The third embodiment relates to a memory for deleting data by cutting off the power supply to the corresponding data storage area or the like when the effective duration of the record data has elapsed.

Figure 3:
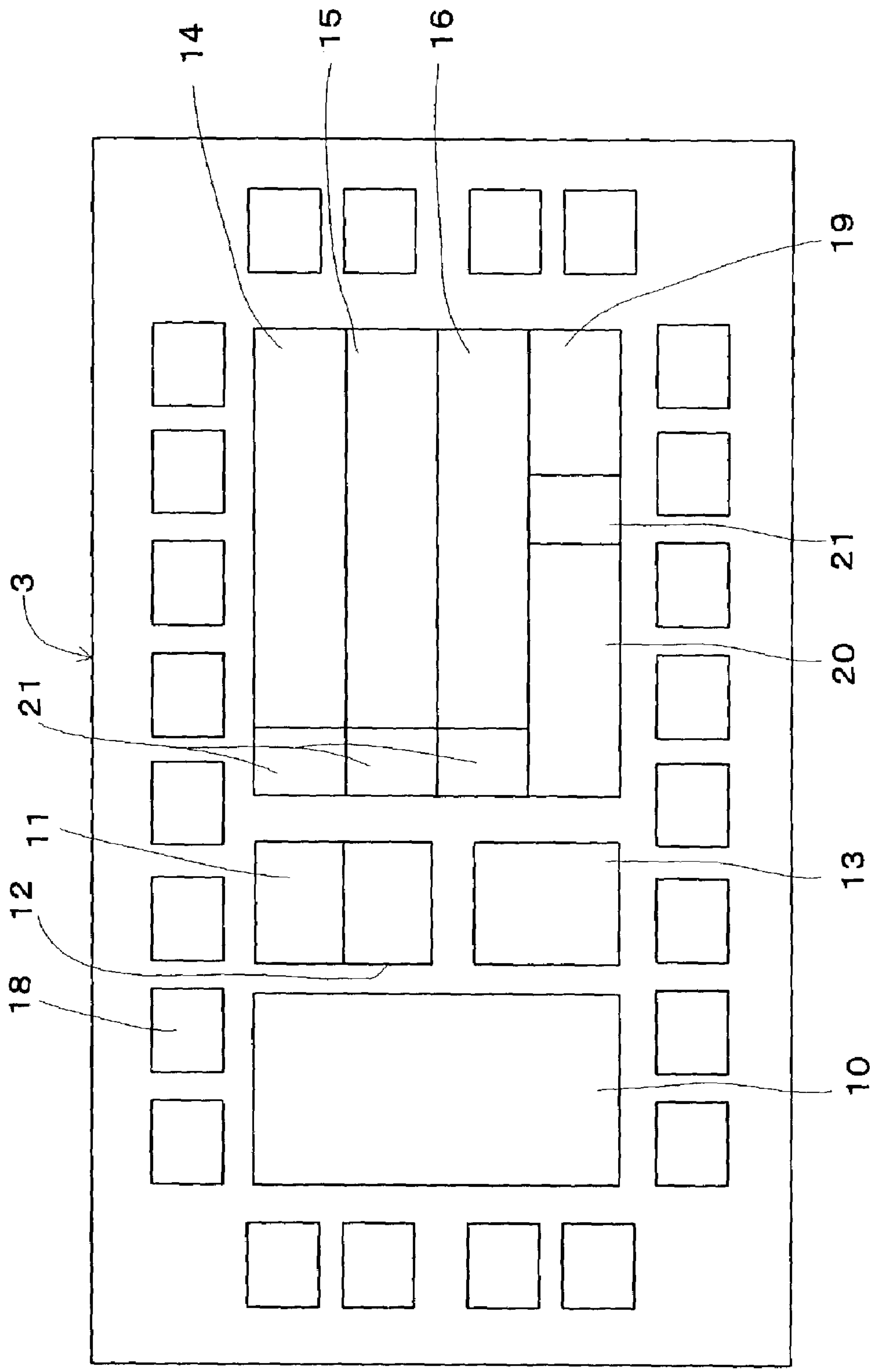
FIG. 3 is a schematic diagram showing a third embodiment of the semiconductor recording medium of the present invention.

As shown in FIG. 3, a memory 3 associated with the third embodiment of the semiconductor recording medium is provided with: the battery 10; the timer 11; the data controller 12; the address controller 13; the data storage areas 14, 15, and 16; the bonding pad 18; the encryption key storage area 19; the encryption circuit 20; and power supplies SWs 21.

The structures and the functions of the battery 10; the timer 11; the data controller 12; the address controller 13; the data storage areas 14, 15, and 16; the bonding pad 18; the encryption key storage area 19; and the encryption circuit 20 are the same as those of the above-explained memories 1 and 2, and their repeating explanations will be omitted here.

Each of the power supplies SWs 21 is provided for the relative one of the data storage areas 14, 15, and 16 and the encryption storage area 19. If the effective duration of recorded data has elapsed, depending on the effective durations set in the relative data storage areas 14, 15, and 16, the corresponding power supplies SWs 21 are cut off on the basis of the instruction of the data controller 12. In the same manner, the power supply SW 21 for the encryption key storage area 19 can be also cut off. In the data storage areas 14, 15, and 16, it is possible to independently make the data reproduction impossible by cutting off the corresponding power supplies SWs 21. On the other hand, by cutting off the power supply SW 21 to the encryption key storage area 19, it is possible to make all data of the memory 3 not-reproducible.

If the third embodiment is applied to the volatile memory, by cutting off the power supplies SWs 21 to the data storage areas 14, 15, and 16, it becomes impossible to access data in the relative data storage areas, and the data will be erased.

On the other hand, in case of the non-volatile memory, it becomes impossible to access data in the relative data storage areas, but the data can be held. Therefore, in the non-volatile memory, it is possible to construct a system in which the cut-off power supplies SWs 21 can be recovered under a predetermined condition, e.g. by paying the owner of the data, to make the data reproduction possible. Each of the power supplies SWs 21 in this case needs to be a cut-off mechanism without any failure such as the fusion of a fuse.

In case of cutting off the power supply SW 21 to the encryption key storage area 19, since the data is held, as with the above case, it is possible to reproduce the data by recovering the power supply SW 21 under a predetermined condition.

It is necessary to cut off the power supplies SWs 21 when the data effective duration has elapsed, even when the external electric power is not supplied to the memory 3, and in that case, an electric power is supplied from the battery 10.

(Fourth Embodiment)

The fourth embodiment relates to a semiconductor recording medium provided with: a data area in which data is recorded; a management information area in which the management information of the data recorded in the data area is recorded; and an effective duration area in which the effective duration of the data recorded in the data area is recorded.

In order to reproduce data which is recorded in the semiconductor recording medium having this structure and whose effective duration is set, there are provided, for the reproducing apparatus side: a reading device for reading out the effective duration recorded in the effective duration area of the semiconductor recording medium; a time-measurement device for measuring a current time point; a comparison device for comparing the effective duration with the current time point; and a prohibition device for prohibiting the reproduction of data if the current time point has passed over the effective duration. Namely, if it is judged by the comparison device that the current time point is within the effective duration, it is possible to reproduce the data recorded in the data area of the semiconductor recording medium. If it is judged that the current time point has passed over the effective duration, the data will not be reproduced. Not limited to the prohibition device for prohibiting the data reproduction, the reproducing apparatus side may be also provided with a destruction device for destroying the recorded data.

In the semiconductor recording medium in the fourth embodiment, as described above, information for controlling the effective duration of recorded data is simpler and an information space for the information is small. Therefore, a large data memory space is ensured. Moreover, this is appropriate for inexpensive and mass production.

(Operation of Semiconductor Recording Medium Associated with the Present Invention)

Figure 6:
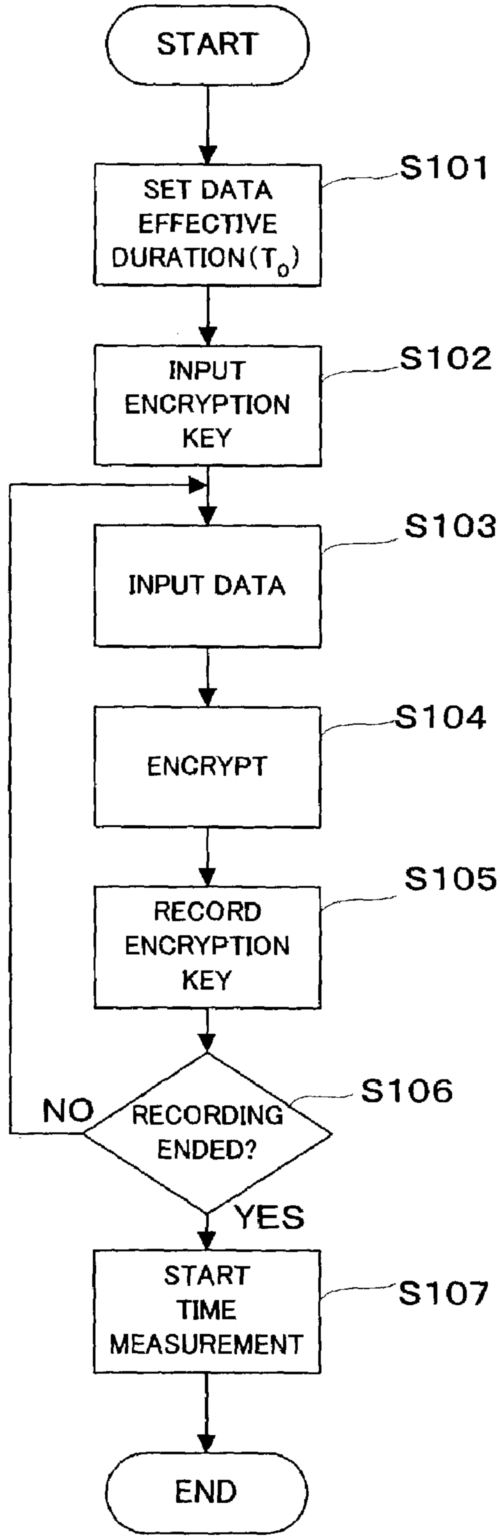
FIG. 6 is a flow chart showing operational flows when recording in the case of encrypting and then recording data with respect to the semiconductor recording medium of the present invention.
Figure 7:
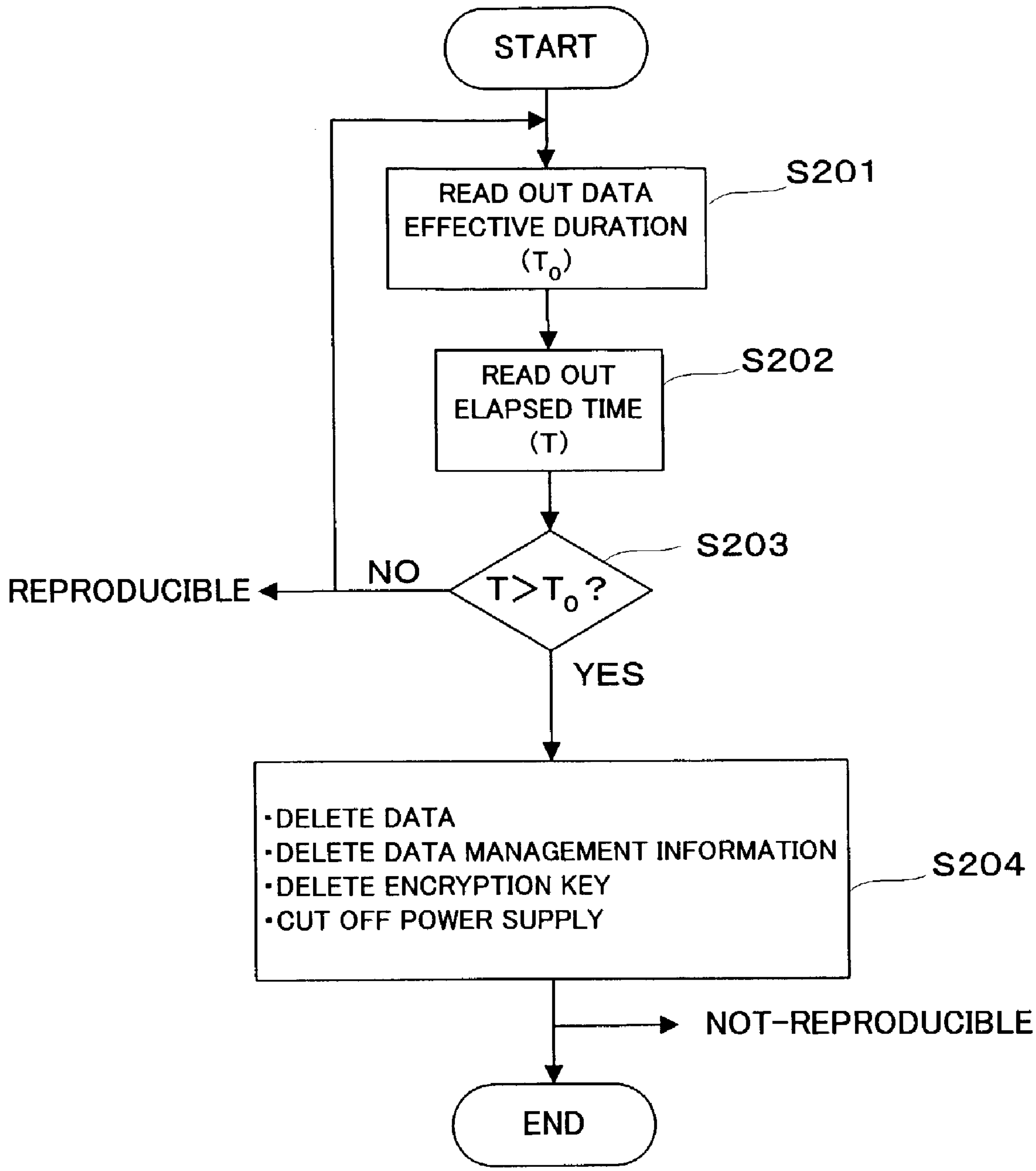
FIG. 7 is a flow chart showing the elapse of time and the reproducibility/non-reproducibility of data as for the semiconductor recording medium of the present invention.

The operational flows of the semiconductor recording medium associated with the present invention will be explained with reference to FIG. 6 and FIG. 7. FIG. 6 is a flow chart showing operational flows in recording of the semiconductor recording medium for encrypting and then recording data. FIG. 7 is a flow chart showing a data effective duration and operations which make the reproduction possible or impossible.

When recording data, as shown in FIG. 6, an effective duration ($T_0$) of data which is recorded is set (step S101). This setting is performed by inputting it from the recording condition setting device 6 shown in FIG. 5, for example. In the case of a commuter pass or ticket, this effective duration ($T_0$) is set by an issuer of the commuter pass or ticket on the basis of its expiration date, and in the case of the rental of music and a video soft, on the basis of their rental period. This information is recorded as the data management information in the data controller 12 in FIG. 1 to FIG. 3, for example.

Next, if the data is to be encrypted and is then recorded, an encryption key is inputted (step S102). This encryption key is inputted from the recording condition setting device 6 shown in FIG. 5, for example, and is recorded in the encryption key storage area 19 shown in FIG. 2 and FIG. 3. The encryption key is used for the data encryption as well as the data decode.

Next, the data to be recorded is inputted (step S103), the inputted data is encrypted on the basis of the encryption key (step S104), and the encrypted data is recorded in a predetermined data storage area, e.g. the data storage areas 14, 15, 16, and 17 in FIG. 1 to FIG. 3 (step S105). It is judged whether or not all data are recorded (step S106), and if there is more data to be recorded (step S106: NO), the recording operation is repeated from the step S103. After the all data are recorded, a timer in a memory, e.g. the timer 11 in FIG. 1 to FIG. 3, is reset to start the time measurement (step S107).

At the start of the timer 11, the comparison between the effective duration ($T_0$) of the set data and the time length measured by the timer 11 is started in the memory, which makes it possible to reproduce the data until the elapse of the effective duration ($T_0$). This comparison is performed at the data controller 12 in FIG. 1 to FIG. 3, for example.

Next, the effective duration of recorded data and the operations which make the reproduction possible or impossible will be explained. As shown in FIG. 7, the data effective duration ($T_0$) is read out (step S201), and an elapsed time (T) is read out (step S202). The effective duration ($T_0$) is a value set at the time of the data recording, and the elapsed time (T) is a time length actually measured by the timer 11.

Next, it is judged whether or not the elapsed time (T) has passed over the effective duration ($T_0$) (step S203). This judgment is performed at the data controller 12 in FIG. 1 to FIG. 3, for example. If the elapsed time (T) has not passed over or reached the effective duration ($T_0$) (step S203: NO), the operational flow returns to the step S201 again to repeat the judgment about the elapsed time. During this time, the recorded data is reproducible.

In the step S203, if judged that the elapsed time (T) passed over or reached the effective duration ($T_0$) (step S203: YES), in order to make the reproduction of the recorded data impossible, the delete of the data, the delete of the data management information, the delete of the encryption key, the cut-off of the power supply, or the like is performed on the basis of the instruction of the data controller 12 (step S204). At this time point, it becomes impossible to reproduce the recorded data. Incidentally, the delete of the data or the like includes complete deleting, erasing or destroying as well as making such a state that the data is not accessible.

In the above-described embodiments, the semiconductor recording medium has been explained as one example of the recording medium of the present invention. However, the present invention is not limited to this. The present invention can be applied to various types of recording media other than the semiconductor recording medium. For example, the present invention may be applied to a disc-shaped recording medium such as a DVD, a CD (Compact Disc) or the like, or may be applied to a non disc-shaped recording medium such as a memory stick, a compact memory, a memory card or the like.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2002-169617 filed on Jun. 11, 2002 including the specification, claims, drawings and summary is incorporated herein by reference in its entirety.

What is claimed is:

1. A recording medium comprising:

a data area in which data is recorded;

a management information area in which management information of the data recorded in said data area is recorded;

an effective duration area in which an effective duration of the data recorded in said data area is recorded;

a data invalidation device for invalidating the data recorded in said data area when an elapsed time has passed over the effective duration;

a power supply device for supplying an electric power; and a power cut-off device for cutting off the electric power from said power supply device, wherein said data invalidation device is a device for cutting off the electric power to said data area by said power cutoff device.

2. A recording medium comprising:

a data area in which data is recorded;

a management information area in which management information of the data recorded in said data area is recorded;

an effective duration area in which an effective duration of the data recorded in said data area is recorded;

a data invalidation device for invalidating the data recorded in said data area when an elapsed time has passed over the effective duration;

a power supply device for supplying an electric power; and a power cut-off device for cutting off the electric power from said power supply device, wherein said data invalidation device is a device for cutting off the electric power to said management information area by said power cut-off device.

3. A recording medium comprising:

a data area in which data is recorded;

a management information area in which management information of the data recorded in said data area is recorded;

an effective duration area in which an effective duration of the data recorded in said data area is recorded;

a data invalidation device for invalidating the data recorded in said data area when an elapsed time has passed over the effective duration;

a power supply device for supplying an electric power;

a power cut-off device for cutting off the electric power from said power supply device;

an encryption device for encrypting the data which is recorded in said data area on the basis of a predetermined encryption key; and an encryption key recording area in which the encryption key is recorded, wherein said data invalidation device is a device for cutting off the electric power to said encryption key recording area by said power cutoff device.

4. A control method of controlling a recording medium, said recording medium comprising:

a data area in which the data is recorded;

an encryption key recording area in which an encryption key for encrypting the data is recorded;

a management information area in which management information of the data recorded in said data area is recorded;

a comparison device for comparing an effective duration of the data with an elapsed time; and a data invalidation device for invalidating the data, said control method comprising the processes of:

(i) deleting the data recorded in said data area by said data invalidation device;

(ii) deleting the management information recorded in said management information area by said data invalidation device; and (iii) deleting the encryption key recorded in said encryption key recording area by said data invalidation device, the data being invalidated by any one of the processes when the comparison device judges that the elapsed time has passed over the effective duration.

5. A control method of controlling a recording medium, said recording medium comprising:

a data area in which the data is recorded;

an encryption key recording area in which an encryption key for encrypting the data is recorded;

a management information area in which management information of the data recorded in said data area is recorded;

a power supply device;

a power cut-off device;

a comparison device for comparing an effective duration of the data with an elapsed time; and a data invalidation device for invalidating the data, said control method comprising the processes of:

(i) cutting off a power supply to said data area;

(ii) cutting off a power supply to said management information area; and (iii) cutting off a power supply to the encryption key recording area, the data being invalidated by any one of the processes when the comparison device judges that the elapsed time has passed over the effective duration.

* * * * *